(12) United States Patent
Barthelemy et al.

(10) Patent No.: US 12,203,964 B2
(45) Date of Patent: Jan. 21, 2025

(54) FLUXGATE CURRENT TRANSDUCER WITH AN ANALOG MEASUREMENT CHANNEL

(71) Applicant: LEM INTERNATIONAL SA, Meyrin (CH)

(72) Inventors: Damien Barthelemy, Carouge (CH); Damien Coutellier, Miribel (FR); Atef Lekdim, Villeurbanne (FR)

(73) Assignee: LEM International SA, Meyrin (CH)

( * ) Notice: Subject to any disclaimer, the term of this patent is extended or adjusted under 35 U.S.C. 154(b) by 0 days.

(21) Appl. No.: 18/580,691

(22) PCT Filed: Jul. 15, 2022

(86) PCT No.: PCT/EP2022/069946
§ 371 (c)(1),
(2) Date: Jan. 19, 2024

(87) PCT Pub. No.: WO2023/001719
PCT Pub. Date: Jan. 26, 2023

(65) Prior Publication Data
US 2024/0264204 A1 Aug. 8, 2024

(30) Foreign Application Priority Data
Jul. 20, 2021 (EP) .................................. 21186819

(51) Int. Cl.
*G01R 15/18* (2006.01)
*G01R 19/00* (2006.01)

(52) U.S. Cl.
CPC ....... *G01R 15/183* (2013.01); *G01R 19/0038* (2013.01)

(58) Field of Classification Search
CPC .......................... G01R 15/183; G01R 19/0038
See application file for complete search history.

(56) References Cited

U.S. PATENT DOCUMENTS

| 4,276,510 A | 6/1981 | Tompkins |
| 4,899,103 A | 2/1990 | Katzenstein |

(Continued)

FOREIGN PATENT DOCUMENTS

| CN | 108333412 | 7/2018 |
| EP | 1230734 | 6/2007 |

(Continued)

OTHER PUBLICATIONS

International Search Report and Written Opinion issued by the International Searching Authority, dated Feb. 8, 2023, for International Patent Application No. PCT/EP2022/069946; 30 pages.

*Primary Examiner* — Jay Patidar
(74) *Attorney, Agent, or Firm* — Faegre Drinker Biddle & Reath LLP

(57) ABSTRACT

Fluxgate current transducer including a control circuit and a fluxgate device comprising a saturable soft magnetic core surrounded by an excitation coil, the control circuit comprising an excitation coil drive circuit connected to the excitation coil configured to generate an alternating magnetic field to alternatingly saturate the soft magnetic core. The excitation coil comprises a first winding and a second winding connected together at a common point forming an input of the first winding and an output of the second winding, the first winding connected in series to a first switch (S1) and the second winding connected in series to a second switch (S2).

13 Claims, 6 Drawing Sheets

(56) References Cited

U.S. PATENT DOCUMENTS

| | | | |
|---|---|---|---|
| 5,161,311 A | 11/1992 | Esmer | |
| 6,346,817 B1 | 2/2002 | Bernier | |
| 9,618,541 B1 * | 4/2017 | Nguyen | G01R 15/183 |
| 2009/0108833 A1 | 4/2009 | Ziegler | |
| 2009/0219009 A1 | 9/2009 | Jansen | |
| 2015/0108967 A1 * | 4/2015 | Barczyk | G01R 15/185 |
| | | | 324/202 |

FOREIGN PATENT DOCUMENTS

| | | |
|---|---|---|
| JP | 2007139459 | 6/2007 |
| JP | 2014119345 | 6/2014 |
| JP | 2015068725 | 4/2015 |
| KR | 102111489 | 5/2020 |

\* cited by examiner

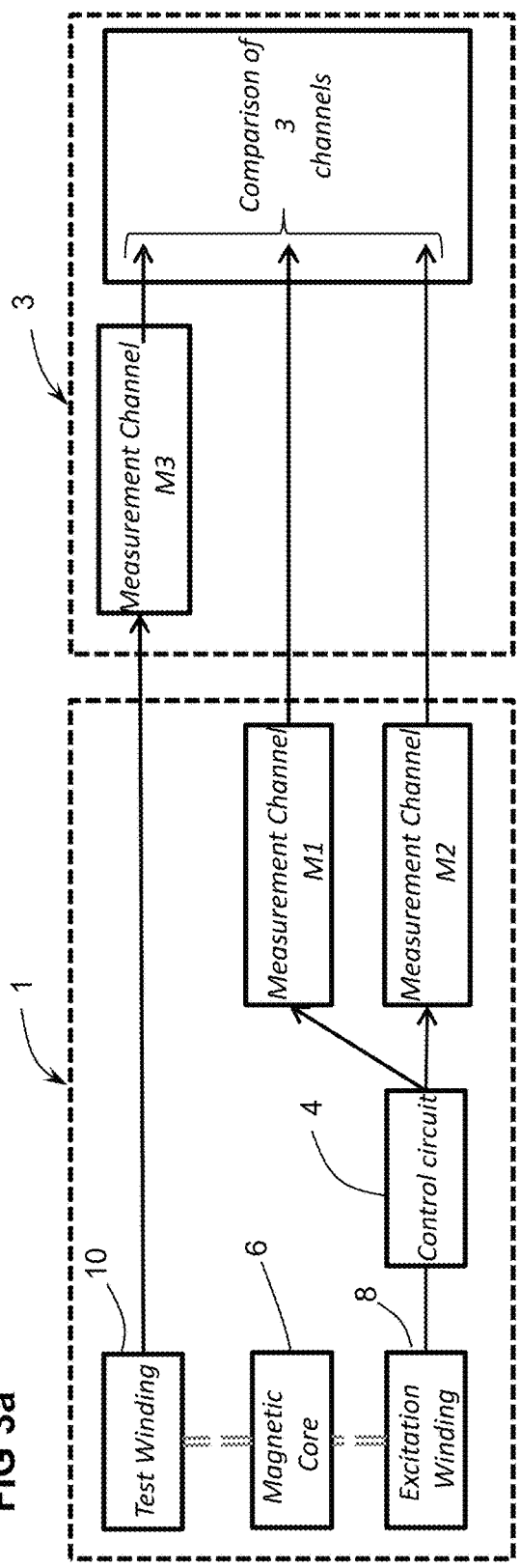
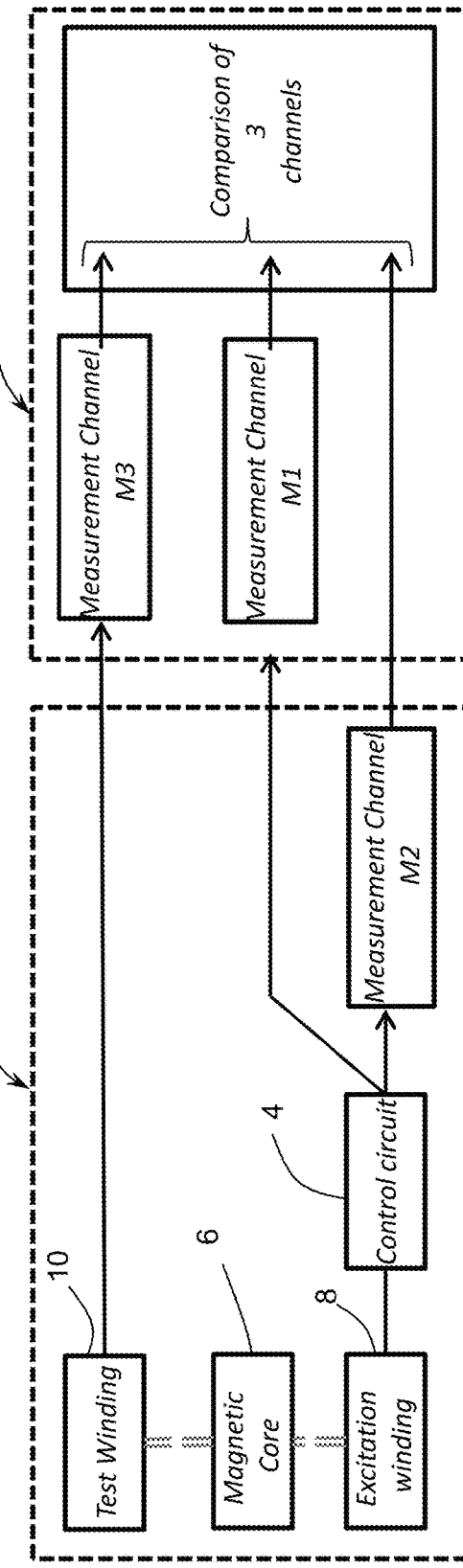

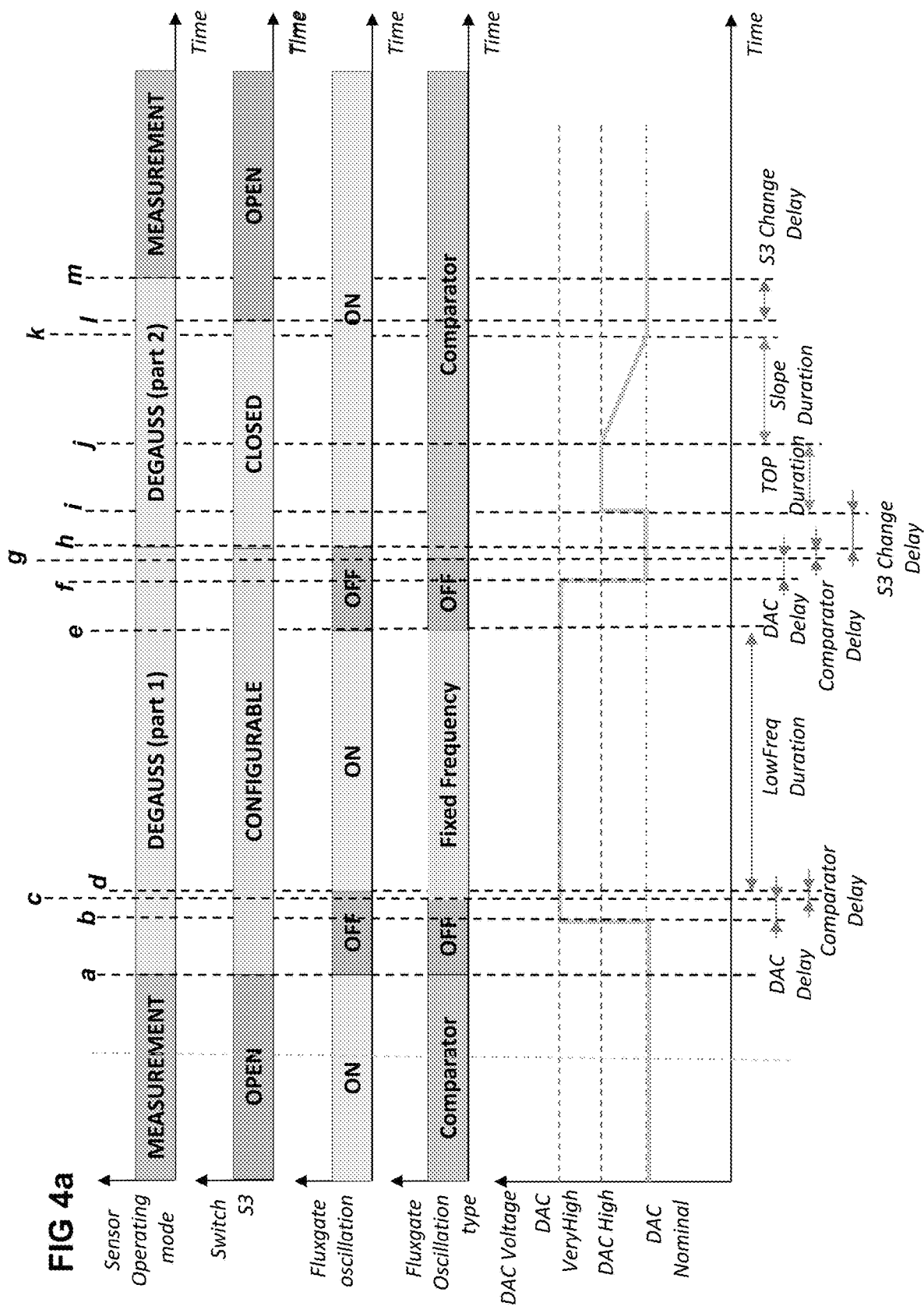

FLUXGATE CURRENT TRANSDUCER WITH AN ANALOG MEASUREMENT CHANNEL

CROSS-REFERENCE TO RELATED APPLICATIONS

The present application is a national stage entry of International (PCT) Patent Application Number PCT/EP2022/069946, filed Jul. 15, 2022, which claims priority to European Patent Application Number 21186819.5, filed Jul. 20, 2021, the complete disclosures of which are expressly incorporated herein by reference.

The present invention relates to a fluxgate transducer for use in current measurement applications.

Fluxgate transducers are well known for use in current measurement applications, whereby the fluxgate transducer measures the intensity of the magnetic field generated by one or more primary conductors carrying the current to be measured. Fluxgate transducers comprise a saturable soft magnetic core surrounded by an excitation coil connected to a control circuit configured to alternatingly saturate the soft magnetic core. In certain configurations, the fluxgate transducer is a small magnetic field sensing component placed in an airgap of a magnetic circuit core that surrounds a central passage through which one or more primary conductors extend. In another known configuration, the fluxgate saturable magnetic core itself forms a central passage through which the primary conductor passes.

In closed-loop transducers, there is a compensation coil magnetically coupled to the magnetic circuit core and connected in a feedback circuit to a signal processing circuit, the compensation coil seeking to cancel the magnetic field generated by the primary conductor(s). Such an arrangement is well known. Although it is possible to use fluxgate transducers in an open-loop manner, whereby there is no compensation coil, in view of the high sensitivity of fluxgate transducers, they are however mainly used in a closed-loop configuration.

In configurations where the fluxgate transducer is a small magnetic field sensing component placed in an airgap of a magnetic circuit core, the compensation coil may be wound around magnetic circuit with airgap, whereas in configurations where the fluxgate saturable magnetic core itself forms a central passage through which the primary conductor passes, the excitation coil may be used to provide the compensation current. In the latter case, the excitation current signal is superimposed on the compensation current signal.

A fluxgate transducer provides for accurate measurement of primary currents or differential currents flowing in one or more primary conductors. Fluxgate transducers have a high sensitivity and low offset compared to the widely known transducers using Hall effect detectors. In addition, fluxgate transducers provide good isolation between the primary and secondary sides and are able to measure low frequency AC currents (up to several kHz) and DC currents. Fluxgate sensor technology is also known to be used for DC and AC leakage current measurement. These types of transducers are implemented in many fields such as:

Battery Management System (measurement of the current flowing through the battery)
Laboratory Reference Sensors (calibration equipment)
Medical Equipment (e.g. Magnetic Resonance Imaging)

However, the electronics required to drive the excitation current for saturation of the magnetic core of the fluxgate detector as well as for driving the compensation current, render such a current transducer more costly and less compact than conventional open loop current transducers with Hall effect detectors. In conventional fluxgate detectors, the excitation current is typically generated by an auto-oscillating circuit architecture typically based on an H-bridge circuit. In such conventional auto-oscillating circuits it is difficult to actively change the saturation level or to define a specific start-up sequence, for instance to implement a degauss procedure.

In certain applications, current measurement systems are associated to safety functions, which is especially the case for sensors intended to measure leakage currents or residual currents. Illustrative examples of such applications include for instance sensors that are used to detect AC and/or DC leakage currents in solar panel applications or in automotive applications, for instance for on board charging systems.

In automotive applications, one of the applicable safety standards is the ISO26262 standard, and depending on the Hazard Analysis and Risk Assessment performed, the safety level of the function is ranked from quality management to ASIL D level safety. In automotive applications, DC leakage current may be a safety function ranked ASIL D which is the highest required safety level. This level of safety requires a high reliability and leads to a high cost.

For certain applications, current transducers should have a very low offset error. This is the case for battery monitoring devices where an offset in the current measured would lead to an over or underestimated state of charge of the battery. For a leakage current sensor or residual current sensor, the sensor will monitor currents that will be most of the time zero, or close to zero, and should detect any change in the current value over a certain limit (threshold value). It is thus necessary for such applications to use a current sensor that have very low offset error.

Current sensors using magnetic material cores for the measurement of magnetic fields, however have the drawback of generating a magnetic offset due to the effects of remanence and coercive magnetic field in magnetic material. Although the magnetic offset in nominal operation can be minimized if the transducer comprises a degauss function that reinitializes the magnetic state of the magnetic circuit material, with the highly sensitive fluxgate transducers a conventional reinitialization may not be sufficient for accurate operation of the transducer.

It is an object of this invention to provide a fluxgate transducer for current measurement that is accurate, yet that is cost effective to manufacture and to implement.

It is advantageous to provide a fluxgate transducer for current measurement that is easily adjusted or calibrated for user requirements.

It is advantageous to provide a fluxgate transducer for current measurement that is easy to install and operate.

It is advantageous to provide a fluxgate transducer for current measurement that is reliable and conforms to high safety level standards.

Objects of the invention have been achieved by providing a fluxgate transducer for current measurement and method of operating a fluxgate transducer according to the independent claims.

Disclosed herein is a fluxgate current transducer including a control circuit and a fluxgate device comprising a saturable soft magnetic core surrounded by an excitation coil. The control circuit comprises an excitation coil drive circuit connected to the excitation coil configured to generate an alternating magnetic field to alternatingly saturate the soft magnetic core.

The excitation coil comprises a first winding and a second winding connected together at a common point forming an input of the first winding and an output of the second winding. The first winding is connected in series to a first switch and the second winding is connected in series to a second switch, the first and second switches controlled by the control circuit to provide an excitation coil current in the first winding generating a magnetic field in the magnetic core in a first direction, and an excitation coil current in the second winding generating a magnetic field in the magnetic core in a second direction opposite to the first direction.

According to a first aspect of the invention, the control circuit comprising a comparator having a first input connected to the excitation coil, wherein the control circuit comprises a PWM module connected to an output of the comparator and configured to control a timing of operation of the first and second switches, including introducing a dead time between switching from one excitation coil winding to the other excitation coil winding.

According to a second aspect of the invention, the transducer comprises an analog measurement channel (M2) connected to the excitation coil after the first and second switches, comprising an ADC module, and wherein the analog measurement channel further comprises a DAC connected to the ADC module and further connected to an input of a comparator having a first input connected to the excitation coil.

According to a third aspect of the invention, the control circuit further comprises a First resistor connected on a high side of the fluxgate device, the control circuit further comprising a third switch S3 placed in a bypass circuit parallel with the First resistor configured to short circuit the First resistor when the switch is switched to the closed position, and wherein the analog measurement channel comprises a reference voltage source to control a supply reference voltage for the ADC module.

According to a fourth aspect of the invention, the fluxgate transducer is connected to a user system to form together a current measurement system having at least three measurement channels, a first PWM channel M1, a second analog channel M2 and a third channel M3 provided by the test winding, the user system configured to compute a comparison of the measurement signals from the three measurement channels in order to determine correct or faulty operation.

In an advantageous embodiment, the comparator first input is connected to the excitation coil after the first and second switches.

In an advantageous embodiment, a second input of the comparator is connected to a DAC supplying an adjustable reference voltage for adjusting the output level of the comparator.

In an advantageous embodiment, the fluxgate transducer further comprises a combinatorial and sequential logic cell connected to an output of a PWM module for the generation of complementary signals including dead-time provided by the PWM module.

In an advantageous embodiment, the fluxgate transducer comprises a capture module connected to an output of the PWM module for capturing the timing of the switching signals.

In an advantageous embodiment, the transducer comprises an analog measurement channel (M2) connected to the excitation coil after the first and second switches, comprising an ADC module.

In an advantageous embodiment, the analog measurement channel further comprises a DAC connected to the ADC module and further connected to an input of a comparator having a first input connected to the excitation coil.

In an advantageous embodiment, the analog measurement channel further comprises an amplifier to increase the gain and scale an offset of the measurement of the signal fed into the ADC module.

In an advantageous embodiment, the control circuit further comprises a first resistor connected on a high side or a low side of the fluxgate device, the control circuit further comprising a third switch S3 placed in a bypass circuit parallel with the first resistor configured to bypass the first resistor when the switch is switched to the closed position.

In an advantageous embodiment, the analog measurement channel comprises a reference voltage source to control a supply reference voltage for the ADC module.

In an advantageous embodiment, the transducer further comprises a test winding wound around the magnetic core, the test winding connected to a connection interface of the fluxgate transducer for connection to an electronic circuit of a user system.

In an advantageous embodiment, the test winding is configured to receive a test current from the user system and to output a voltage to the user system in a second mode of operation corresponding to a measurement signal of the magnetic field in the fluxgate device such that the test winding provides a third measurement channel M3.

In an advantageous embodiment, the fluxgate transducer is connected to a user system to form together a current measurement system having at least three measurement channels, a first PWM channel M1, a second analog channel M2 and a third channel M3 provided by the test winding, the user system configured to compute a comparison of the measurement signals from the three measurement channels in order to determine correct or faulty operation.

In an advantageous embodiment, the electronic circuit of the user system is configured to use two of the three measurement signals that have values closest to each other, and to discard the other measurement signal in case of a fault that affects one of the measurement channels.

Also disclosed herein is a method of operating the fluxgate transducer in order to perform a demagnetization procedure comprising:
  step a) stopping the oscillation of the fluxgate device;
  step b) after step a, restarting the oscillation of the fluxgate device at a fixed frequency and high first saturation depth for a duration of a limited number of half periods, preferably less than twenty half periods, more preferably less than ten half periods, for instance between one to five half periods;
  step e) after step b, stopping the oscillation of the fluxgate device;
  step i) after step e, operating the fluxgate device in auto-oscillating sequence at an intermediate second saturation depth less than said first saturation depth;
  step j)—after step i, progressively reducing the saturation depth to a nominal value.

Further objects and advantageous features of the invention will be apparent from the claims, from the detailed description, and annexed drawings, in which:

FIG. 3a is a schematic simplified block diagram of a fluxgate transducer measurement system according to an embodiment of the invention illustrating a first configuration for enhancing safety requirements;

FIG. 3b is a diagram similar to FIG. 3a illustrating a second configuration according to an embodiment of the invention;

FIG. 4a illustrates a procedure for resetting the magnetic circuit remanence to a defined magnetic offset value (e.g. corresponding to the one set up during the initial calibration of the transducer);

Figure 1A:
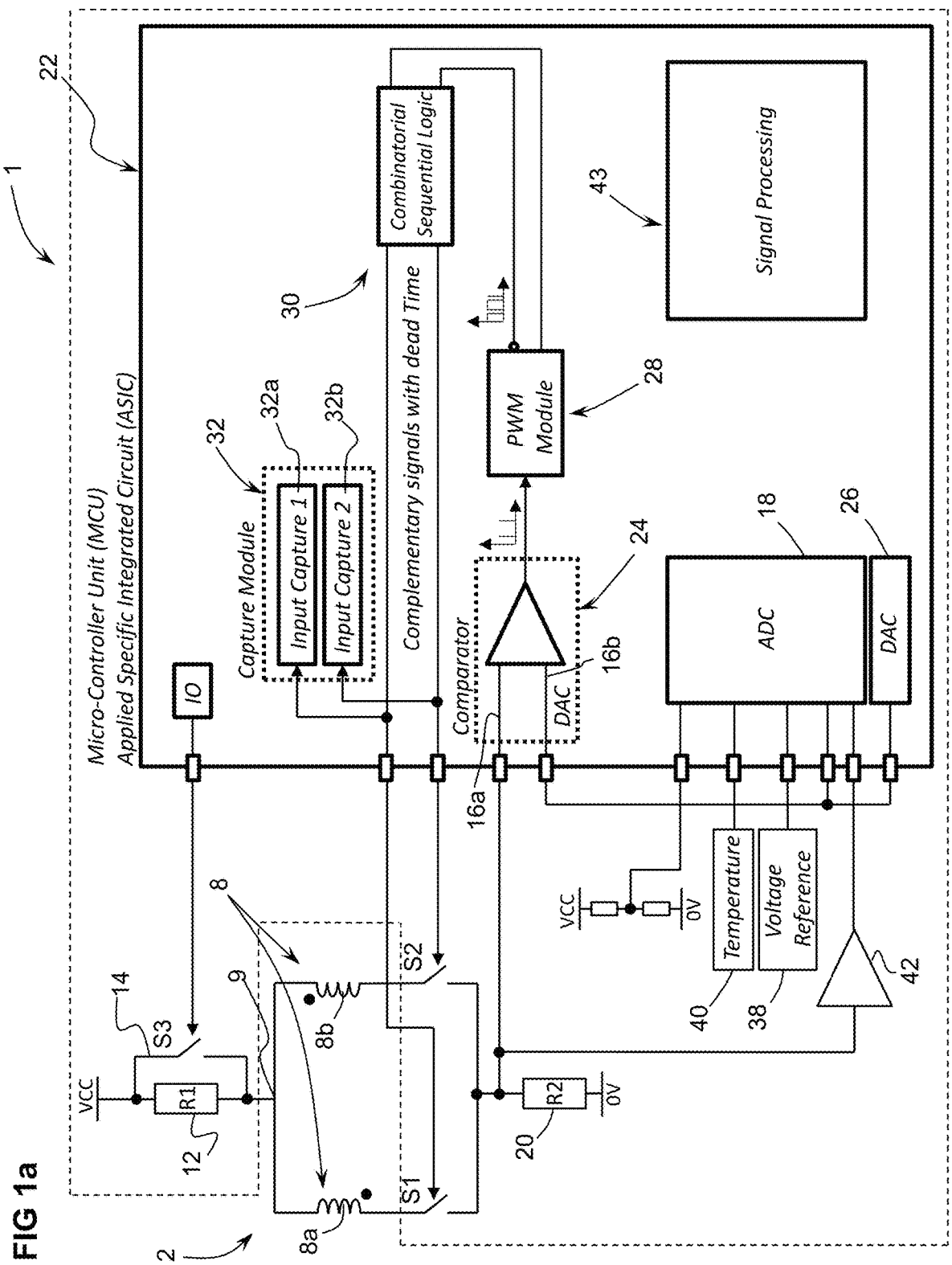
FIG. 1a is a schematic circuit block diagram of a fluxgate transducer according to an embodiment of the invention.

Referring to the figures, a fluxgate current transducer for measuring a primary current flowing in one or more primary conductors 1 comprises a fluxgate device 2 and a control circuit 4 connected to the fluxgate device.

The fluxgate device 2 comprises a saturable magnetic core and an excitation coil 8 wound around the saturable magnetic core 6. The excitation coil 8 comprises two windings, a first winding 8a and a second winding 8b, connected together at a common point 9 forming the input of the first winding and the output of the second winding. The excitation coil 8 is connected to an excitation coil drive circuit including a power supply controlled by the control circuit 4 configured to feed an excitation current through the excitation coil to alternatingly saturate the saturable magnetic core 6. More specifically, the first and second windings 8a, 8b are supplied with a current in a sequential alternating manner, whereby the current in the first winding 8a generates a magnetic field in the magnetic core in a first direction, and the current in the second winding 8b generates a magnetic field in the magnetic core in a second direction opposite to the first direction, the changing magnetic fields in the magnetic core being switched sequentially, optionally with a short dead time period between the changeover from one winding to the other winding.

The magnetic core is preferably made of a high permeability nano-crystalline magnetic material, for instance an FeSi or FeCo based nano-crystalline material due to the low temperature drift, high permeability, low coercive field, and adaptable permeability value of such materials. The magnetic material may have the following properties of BH loop shapes: rectangular (longitudinal field annealed), round (no field annealed, flat (transversal field annealed). Depending on the BH loop shape, the control circuit is configured to reach alternating saturation of the magnetic material as a function of the material's BH properties.

The switching of the excitation current to supply either the first winding or the second winding is controlled by the control circuit 4.

The control circuit 4 comprises a microcontroller 22 that controls the current flowing in the excitation coil windings 8a, 8b via first and second switches S1, S2 connected in series to the respective first and second windings. The switches may for instance comprise or consist of transistors. The term "microcontroller" is intended to include any IC processor, MCU, ASIC, FPGA or other processing circuits capable of controlling the operation of the switches S1, S2.

Figure 1B:
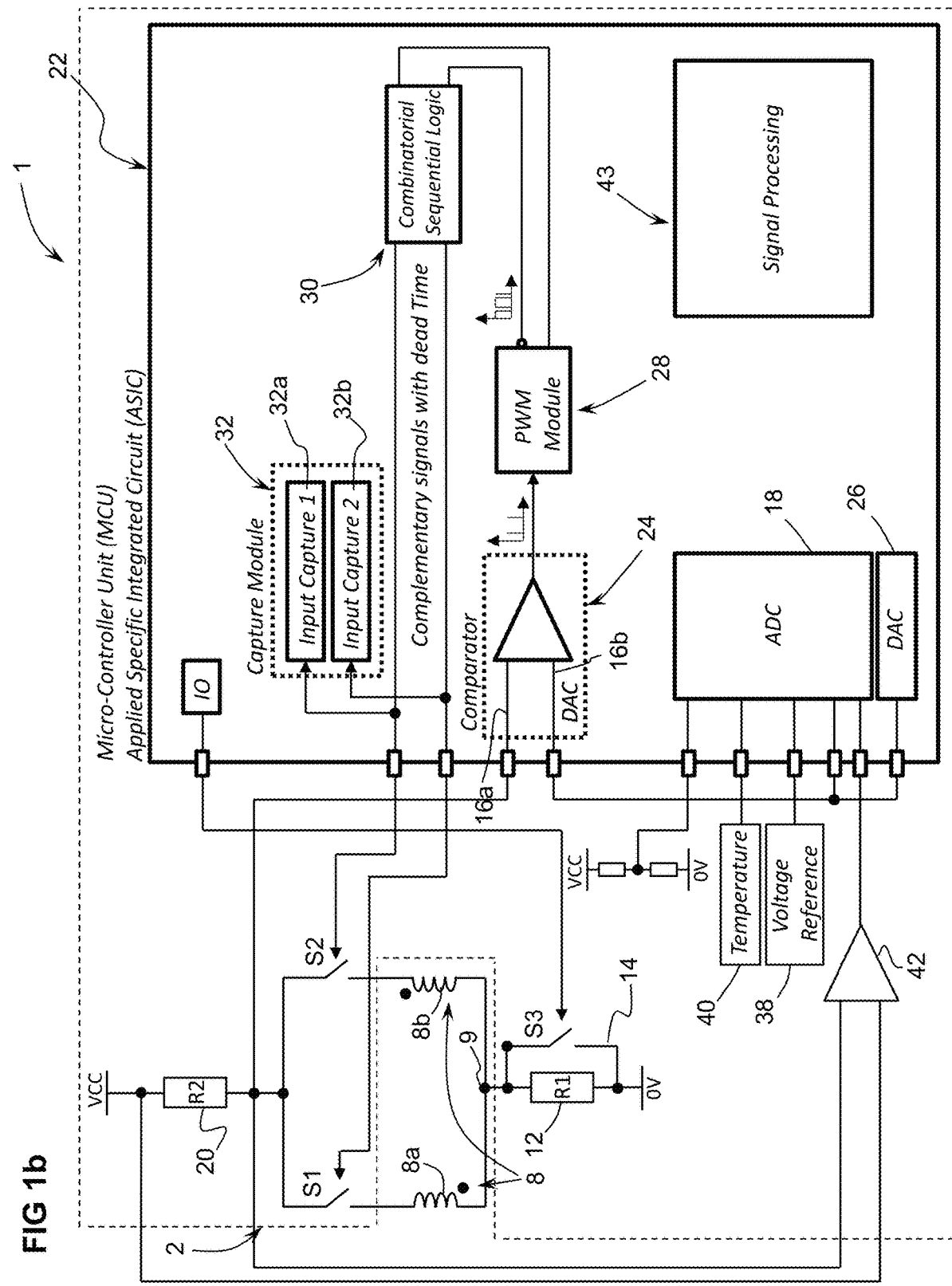
FIG. 1b is a schematic circuit block diagram of a fluxgate transducer according to another embodiment of the mention.
Figure 2:
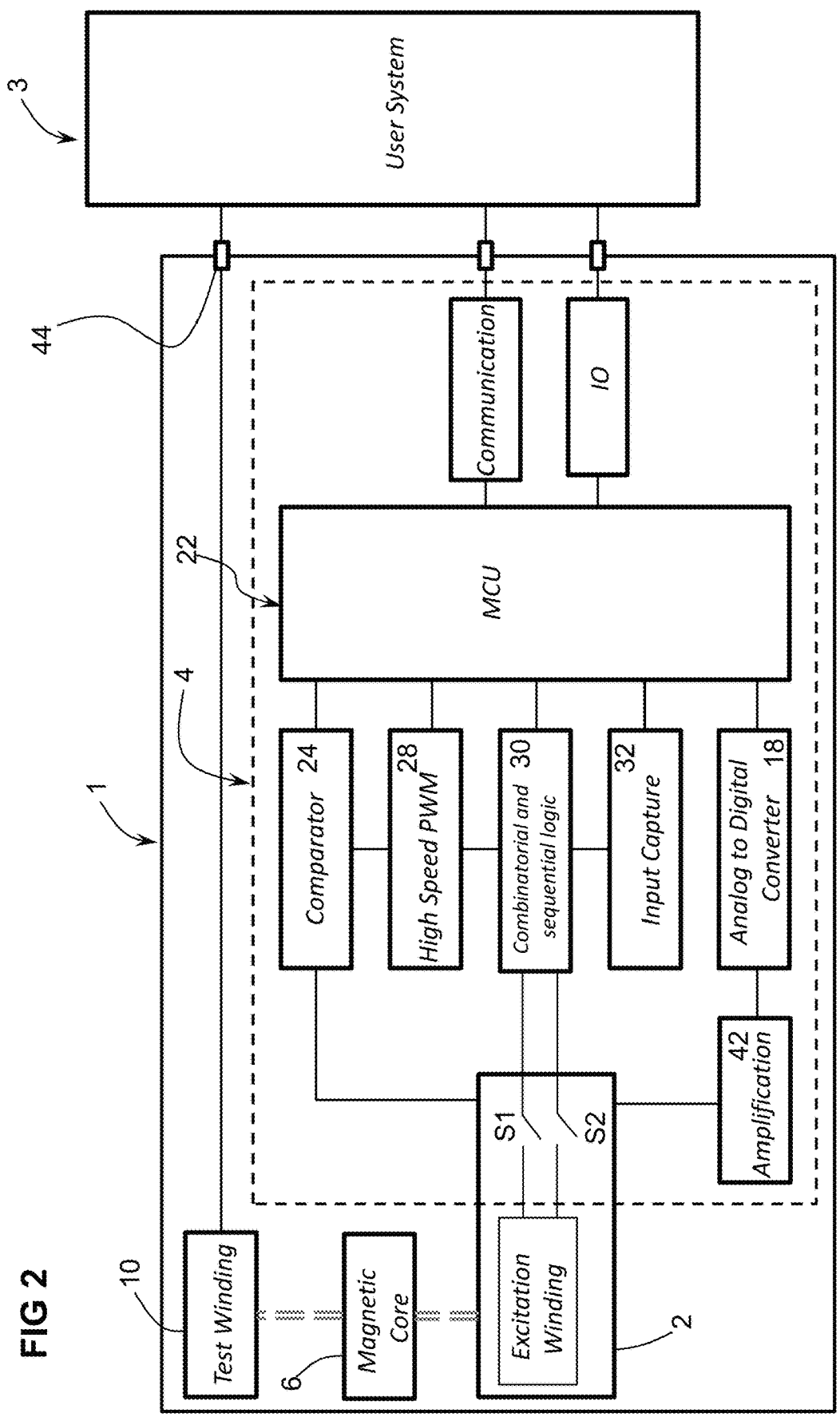
FIG. 2 is a schematic block diagram of a current measurement system with a fluxgate transducer according to an embodiment of the mention.

The control circuit may comprise a first resistor 12 connected to the common point 9. In the embodiment of FIG. 1a the first resistor 12 is connected to the common point 9 on a high side of the fluxgate device. In the embodiment of FIG. 1b the first resistor 12 is connected to the common point 9 on a low side of the fluxgate device. The first resistor 12 may be used to set-up the sensitivity of the fluxgate transducer for a pulse-width modulation (PWM) measurement mode.

The control circuit may further comprise a second resistor 20 connected to the excitation coil windings 8a, 8b after the switches S1, S2. The second resistor may be used to set-up the sensitivity of the fluxgate transducer for an analog measurement mode.

The control circuit may comprise a third switch S3 placed in a bypass circuit 14 parallel with the first resistor 12 in order to by-pass the first resistor and increase the current through the excitation coil. The increased current may for instance serve to perform a deep saturation of the magnetic core, for instance during a degauss procedure.

The control circuit comprises an auto oscillating circuit portion comprising a high speed comparator 24 in the microcontroller 3. The comparator 24 has a first input 16a connected to the excitation coil after the first and second switches S1, S2, between the switches and the second resistor 20. The comparator is configured to detect the peak current in the excitation coil when the magnetic core reaches saturation, for control of the auto oscillating switching signals that open and close the switches S1, S2 in alternating manner.

The comparator may be connected at a second input 16b to a fixed reference voltage (such as ground or at fixed voltage level), or in a preferred embodiment, to a DAC 26 (digital to analog converter) supplying an adjustable reference voltage for adjusting the output voltage of the comparator. The comparator can implement selectable hysteresis value and/or digital filtering to avoid glitch during winding switches S1, S2 transitions.

The output of the comparator may advantageously be connected to a high speed PWM module 28 which is used to manage the timing control of both winding switches S1, S2, in particular to control a dead time between switching the excitation supply current from one winding to the other. The PWM module is used to synchronize the control of winding switches S1, S2. It limits maximum oscillating frequency (in case of an over current for example) that would cause the winding switches S1, S2 to be destroyed due to high switching losses. It is used to accurately generate dead-time between the winding switches S1, S2 (in the range of nano-seconds) to prevent shoot through during transitions of the winding switches S1, S2. The PWM module is also used to reduce the EMI noise by spreading the operating frequency of the fluxgate over a nominal one.

The output of the PWM module may advantageously be connected to a Combinatorial and Sequential Logic cell 30 that serves to to control alternatively the winding switches S1 and S2 and insert the dead time at the proper timing. It may basically comprise a D Flip Flop (for the S1 and S2 sequence) with AND and NOT gates for the dead-time insertion. This circuit portion thus acts a filtering and synchronization unit including control of dead-time between switching.

The control circuit comprises a capture module 32 with a first input capture 32a and second input capture 32b connected to an output of the PWM module 28 and logic cell 30 circuit portion, the input capture used to capture the timing of the switching signals to measure the duty-cycle of the fluxgate for a PWM measurement mode. It is more convenient and reliable to measure the synchronized signals from the microcontroller 22 instead of using a transistor gate or drain signal (e.g. for MOSFET) as these will drift in amplitude and slope with regards to temperature, supply voltage and leakage current to be measured. A signal processing module 43 is configured to calculate the current from the input capture module 32 and signals output by the ADC 18.

For an analog measurement output, the control circuit may advantageously further comprise a reference voltage source 38 to compensate ratiometricity errors when the ADC is not referenced to an accurate/low drift voltage source.

The reference voltage source may be external to the microcontroller and used as a low drift reference voltage for the ratiometricity of an analog to digital converter (ADC) in the microcontroller 22.

The control circuit may advantageously further comprise a temperature measurement input for receiving a value of a temperature measurement performed either within the microcontroller or externally of the microcontroller to perform a temperature compensation on the fluxgate measurement output if necessary.

The control circuit may advantageously further comprise an amplifier 42 to increase gain and scale offset of the measurement signal taken across the second resistor 20 and fed into the microcontroller 18.

The fluxgate transducer according to embodiments of the invention comprises more than one measurement channel, including a first measurement channel provided by the PWM signal controlling the excitation coil switching, and a second measurement channel provided by a connection to the excitation coils measuring the current in the excitation coils and processing this analog measurement signal in the microcontroller after conversion by an analog to digital (ADC) circuit 18.

The operation of the PWM module may include the following modes:
  not synchronized by the comparator in a fixed frequency (mainly used for the degauss sequence), and
  synchronized by the comparator where the frequency depends on the comparator trigger signal (used for the measurement sequence and also during degauss)

In both of these operating modes of the PWM module the duty cycle applied by the PWM module can be either fixed or variable.

The arrangement of the fluxgate transducer according to embodiments of the invention advantageously allows to:
  manage Fluxgate Modes of operation (fixed frequency or auto-oscillating) whereby fixed frequency operation is used to perform a degauss sequence. Low frequency operation enhances the efficiency of the degauss sequence versus high frequency operation;
  manage deterministic stops and starts of the transducer e.g. for a degauss sequence or to put the transducer in sleep mode, whereby the combinatorial and sequential logic cell can control the start and stop by putting both switch S1, S2 drive signals to low;
  increase or decrease magnetic field saturation values without additional hardware;
  allow natively analog and PWM redundant measurement for safety applications;
  limit the number of components (passive, active and MCU IO's).

The fluxgate transducer according to embodiments of the invention is thus capable of:
  providing different modes of operation including an auto-oscillating mode of operation with variable duty-cycle, or a fixed frequency mode that may be used during degauss for example;
  mitigating EMI noise by spreading frequencies over a predetermined range;
  allowing adjustment (increase or decrease) of the magnetic field saturation level directly in the transducer (for a degauss sequence for example)
  allowing stopping of the control circuit without fully unpowering it in order to perform check sequences (for safety functions for example or to place the fluxgate transducer in sleep mode)
  providing several measurement channels, including an analog channel and a PWM channel for inherent redundancy and safety functions for example.

In an embodiment of the invention, the fluxgate device 2 may further include a test winding 10 wound around the magnetic core 6, in addition to the winding(s) of the excitation coil. This test winding increases the diagnostic coverage of the transducer allowing to attain a high safety standard, such as the highest ASIL Level, in a simple architecture. One of the applications in which embodiments of the invention may be advantageously implemented if for use in automotive On-Board charger applications, to measure DC and AC currents.

The test winding may be connected to a connection interface 44 of the fluxgate transducer for connection to an electronic circuit of a user system 3. The electronic circuit of the user system is configured to inject a test current into the test winding and to verify the measurement output of the fluxgate transducer to check the accuracy and proper functioning of the transducer. The measurement outputs from both the PWM measurement channel (the first measurement channel M1) and the analog measurement channel (the second measurement channel M2) may be checked with respect to an expected measurement value corresponding to the injected test current, and/or compared with each other.

The injection of a test current in a test winding is a good way to validate that the sensor operates properly at the time of the test. When the test is finished and a problem occurs during normal operation (e.g. loss of accuracy due to component drift), it is necessary to wait for a new test cycle to verify the unproper behavior of the sensor and usually additional mechanisms are required to diagnose the problem online. The injection of current in a test winding is not a redundant path as it is only used during specific time periods and intervals (before start-up) but not used during nominal operation of the sensor. A test winding could be operated and controlled by the user system to check linearity of the fluxgate transducer measurement output over the operating range, however this test procedure must be performed faster than the required reaction time of the fluxgate transducer. The bigger the operating range, the longer the duration of the linearity check, which would require reducing the reaction time of the fluxgate transducer in order to be able to carry out the check.

The user system may also or alternatively use the test winding to verify a DC tripping curve and an AC tripping curve, but not necessarily the linearity. The user system injects a current in the test winding and measures the duration required by the sensor to trip.

According to an aspect of the invention, the test winding is configured to be used during operation of the fluxgate transducer to provide a further measurement channel (a third measurement channel M3). The test winding may be connected to a signal processing circuit in the user system 3 that performs a PWM measurement (similar to the PWM measurement included in the fluxgate transducer). The test winding voltage has a square wave shape with a duty-cycle that varies proportionally to the leakage current. The user system measures the duty-cycle e.g. using zero crossings of the test winding voltage, whereby a comparator can be used to detect the 0V transitions.

The user system 3 can perform a comparison of the three measurement channels, M1, M2, M3, two of which are processed within the fluxgate transducer which outputs two measurement signals to the user system 3, and one of which (from the test winding) is processed in the user system to compute a third measurement value. Differences in the measurement values output by the three measurement channels, for instance differences greater than a predefined threshold, may be used to detect a fault in the measurement system. For safety functions, in case of a fault in the measurement system, the current measurement system can be configured to rely on two of the three measurement signals that have values closest to each other, and to discard the other measurement signal.

In addition, in an embodiment, the fluxgate transducer may be configured to compute internally a comparison of the analog and PWM measurement channels M1, M2 which already provides a first level of safety, and the measurement output by the fluxgate transducer may then be compared to the measurement computed in the user system from the signal of the test winding, providing a second level of safety.

Any common mode causes of failure or faulty operation of the fluxgate transducer due for instance by faults in the magnetic core or the excitation coil may be checked by other diagnostics, such as
- measure the oscillating frequency of the fluxgate using the test winding (wrong frequency means wrong operation (e.g. magnetic circuit damaged, auto-oscillating circuit not working properly);
- measure the amplitude of the voltage on the test winding during operation (center tapped bridge component damaged, resistor increase);
- verify that the degauss sequence has occurred by monitoring the test winding and verifying the frequency (good sequence in frequency especially means good reset of magnetic performance);

The channel measurements at the user side are preferably PWM measurements as these do not interfere with each other when compared with analog measurement.

The two windings forming the center tapped excitation coil preferably have the same number of turns, however the number of turns of the test winding may be different to the number of turns of the excitation coil. In particular, the test winding may advantageously have more turns in order to have higher voltage.

The proposed safety architecture can be synthesized in providing a fluxgate transducer with windings accessible by the user system that can be used either to inject a test current and test transducer internal measurement channels or as external measurement channels directly connected to the user system. An advantage of the test winding configuration of the present invention is to mutualize a single element for both injecting a current for testing of the transducer, and measuring the primary current in an additional (redundant) channel for safety. The bandwidth and reaction time of the measurement channel at the user system side is equivalent to the fluxgate transducer when compared to a reduced bandwidth in the case the test winding is used to test linearity over the full operating range in real time. Usually at power-up, a circuit of the user system injects a current in the test winding and verifies the measurement. If the measurement is successful, then the circuit of the user system activates the measurement on the test winding.

Usually at start-up (or before energizing the live part), the user system uses the test winding to inject a current in the fluxgate transducer. The user system injects current in the test winding and verifies that the values injected correspond to those measured by the measurement channel internal to the transducer. The user system can also measure the PWM directly on the test winding while injecting the current. Finally, the user system performs a comparison of the current injected as measured in the user system and as measured in the fluxgate transducer. If the comparison is below a predefined threshold, it means that test winding is working properly as well as the fluxgate transducer internal measurement channels.

Only when this test passed, it means that the fluxgate transducer operates properly (means measures correctly the leakage current). Then the user system is able to energize safely the live part and the user system disconnects the injection circuit to prevent this circuit interfering with the operation of the fluxgate transducer.

According to an aspect of the invention, the fluxgate transducer may include a sequence to reset the magnetic circuit to a deterministic one that permit to ensure that the magnetic offset of the fluxgate transducer remain the one set-up during the calibration. This sequence may advantageously be operated in the following situations:
- at every power-on of the fluxgate transducer
- upon request of the user system
- after an overcurrent One of the main problems solved is related to the way the fluxgate stops its operation at power down, which affects the magnetic offset when restarting. A reset is also important when the current through the fluxgate transducer is out of the measurement range (overcurrent).

In a stop sequence of the fluxgate transducer 1, when power is switched off, voltage supplying the fluxgate transducers starts decreasing rapidly, whereby once the amplitude of the voltage descends below a certain level, the amplitude of the excitation current falls below a threshold corresponding to the value of the DAC input 16b of the comparator 24.

The comparator 24 is thus not triggered nor is the high speed PWM module 28, and the PWM module 28 will operate the fluxgate transducer in a fixed frequency mode (e.g. which in the illustrated example is set-up to 5 kHz).

In this example, before power off, the fluxgate magnetic core auto-oscillates at a certain frequency, for instance at 20 kHz, with substantially constant flux densities at saturation +Hsat and −Hsat. After power off, the fixed frequency controlled by the PWM module 28 is set at a lower value (for instance 5 kHz in this example), which leads to the fluxgate magnetic core having variable (uncontrolled) flux densities +Hsat and −Hsat. From the magnetic point of view, this corresponds to switching from a high frequency hysteresis cycle with a defined depth of saturation where the flux densities +Hsat and −Hsat are set by the DAC value input of the comparator 24, to a low frequency hysteresis cycle with an undefined depth of saturation. A cause of this undefined depth of saturation is that the lower the frequency, the deeper the saturation, first, because the current can rise higher if the half cycles are longer given a high enough supply voltage to overcome the resistance of the current path, and second, because the core will stay longer in a saturated state even after the limited voltage does not allow a further increase of the current.

At the end of the switch off sequence, the magnetic material will stop in an unknown state issued from a low frequency hysteresis cycle.

At the next power-up, the fluxgate transducer will start from this unknown state and stabilize rapidly at the high frequency auto-oscillating state, but the transition to the high frequency state does not recover totally the magnetic state of the magnetic material. The magnetic offset is partially affected by the switch off sequence. This difference comes from the fact that during normal auto-oscillating operation, the hysteresis cycle is swept at a high frequency, and during switch off the hysteresis cycle is swept at low frequency. The magnetic material exhibits different magnetic characteristics and hysteresis cycles when the frequency changes. This is also reinforced by the fact that the depth of saturation is different in both situations.

A first solution to avoid starting from an unknown magnetization state of the magnetic core would be to prevent the operation of the fluxgate transducer at low frequency and stop oscillation as soon as the excitation signal voltage inputted into the comparator drops below a certain level that is higher than the DAC input value. The instant when the fluxgate transducer should be stopped should be deterministic in order to ensure the magnetic circuit remains always in the same state.

A second and preferred solution includes performing a specific start-up sequence without verifying the stopped state of the fluxgate transducer in order to reset the magnetic state of the magnetic material to a defined one that would be deterministic.

An example of an advantageous sequence is illustrated in FIG. 4a. This sequence can be generalized as two sequences labelled DEGAUSS (Part 1) and DEGAUSS (Part 2). The label DEGAUSS in this sequence is not intended to represent a conventional degauss procedure where magnetic field and flux density equals to 0, but instead is intended to represent a demagnetization procedure imposing a deterministic magnetic state of the magnetic material (i.e. with a known or pre-defined magnetic offset). The method to reinitialize the magnetic state of the magnetic circuit can be used after power-up, over-load or after any scenario that may adversely affect the magnetic state of the magnetic material (e.g. closing a relay that charges capacitors with a high peak current).

Normal Operation ("Measurement"):

Switch S3 is open in order to limit the fluxgate saturation; S1 and S2 are closed alternatingly and opened when the comparator detects that the current passing through the second resistor R2 has increased to a value higher than determined by the output voltage of the DAC fed to the comparator input 16b. After each opening of the switches, a certain dead time determined by the PWM module passes after which the switch that had been open during the preceding half cycle is closed via the logic 30, e.g. using a flipflop.

DEGAUSS (Part 1):

Step (a)—The demagnetization procedure is started by the control circuit stopping the oscillation of the fluxgate device 2 by opening the excitation coil switches S1, S2 (i.e. set to off) at point (a). The bypass circuit switch S3 may also be actuated by the control circuit to close the switch (i.e. set to on), however in certain embodiments the bypass circuit switch S3 may be left open (i.e. remain set to off). Whether the bypass switch is actuated by being closed or left opened will depend on magnetic properties of the material used for the fluxgate core. The signal to the first input 16a of the comparator 24 is also kept constant as the excitation coil switches S1, S2 are opened, thus shutting off the comparator output signal.

Step (b)—The DAC 26 is then controlled by the signal processing module 43 to output a high amplitude first voltage signal, e.g. close to its maximum value (corresponding shut-off currents for the fluxgate so high that they cannot be reached). From instant d (end of the comparator delay point (d)) onwards, the fluxgate transducer is operated at a fixed frequency defined by configuration values in the PWM module, the number of half periods for this sequence being defined by the signal processing unit 43. The excitation current, as well as the depth of saturation, is naturally limited by the supply voltage and the circuit first resistor 12 and second resistor 20.

In general, the frequency must be lower than the minimum oscillation frequency reached during the switch off sequence, and the lower the better. As this sequence can be time consuming for the start-up of the fluxgate transducer, the number of half periods and the duration of the overall sequence should be minimized, for instance less than ten half periods, for instance between one to five half periods. The current consumption of the fluxgate transducer is maximum or close to maximum during this sequence. After this sequence, the fluxgate core will be in a state of high magnetization in one or the other polarity depending on the polarity of the last half cycle that is well defined because of the sequence being the same each time it is applied.

Step (e)—The fixed frequency step is ended by the control circuit stopping the oscillation of the fluxgate device 2 by opening the excitation coil switches S1, S2 (i.e. set to off) at point (e).

Step (f)—The high amplitude first DAC voltage signal fed into the second input 16b of the comparator is set to a nominal voltage amplitude, which may be zero or a non-zero nominal voltage amplitude lower than said high amplitude voltage signal.

DEGAUSS (Part 2): During or after a DAC delay (point (g)), and a Comparator delay (point (h)), the excitation coil switches S1, S2 are closed and the bypass circuit switch S3 may also be actuated by the control circuit to change state by closing the switch (i.e. set to on). Whether the bypass switch S3 is actuated depends on whether it is already closed or not in the previous sequence.

Step (i)—The DAC voltage signal fed into the second input 16b of the comparator is set to an intermediate high second voltage amplitude, which is greater than the nominal voltage amplitude and lower than said high amplitude first voltage signal. The fluxgate transducer is thus operated in auto-oscillating sequence where the saturation depth is slightly decreased from a high value to a nominal value. This procedure is available when the first resistor 12 is short circuited (switch S3 is closed) and the saturation depth is increased. As the fluxgate transducer operates in auto-oscillation, the excitation current is only increased during the saturation phase of the magnetic core and power consumption is reduced compared to the previous sequence (although still higher than in nominal operating mode).

Step (j)—After a short sequence at the intermediate high second voltage amplitude (point (j)) the amplitude of the DAC voltage signal fed into the second input 16b of the comparator is progressively reduced over a slope duration back to the nominal voltage (point (k)).

Step (k)—The bypass circuit switch S3 may also be actuated by the control circuit to open the switch (i.e. set to off), however in certain embodiments the bypass circuit switch S3 may be left closed (i.e. remain set to on). Whether the bypass switch is actuated by being opened or left closed will depend on the magnetic properties of the material used for the fluxgate core.

Step (m)—After a certain bypass switch change delay, the measurement procedure of the transducer may commence.

In FIG. 4a:

DAC delay: Delay expressed in micro-seconds necessary for the DAC to reach the desired setting. This parameter shall be higher than the settling time of the DAC itself;

Comparator delay: Delay expressed in micro-seconds necessary for the comparator to reach the actual value after activation. This parameter shall be higher than the comparator power on/activation delay or comparator filter steeling time delays;

LowFreg duration: This duration expressed in milli-seconds corresponds to the desired duration at which the fluxgate shall oscillate a predefined fixed frequency;

S3 Change delay: Delay expressed in micro-seconds necessary for the fluxgate to reach a steady state auto-oscillating frequency after a change of switch S3 state. The state configurable means that the switch S3 can be either open or closed depending on the desired setting;

TOP duration: This duration expressed in micro-seconds corresponds to the desired duration at which the fluxgate shall auto-oscillate at a high current (DAC High);

Slope duration: This duration expressed in micro-seconds corresponds to the slope from which the DAC decrease from High to Nominal value. The fluxgate is in Auto-oscillating mode and the frequency will slightly increase while the DAC value reduces.

Figure 4B:
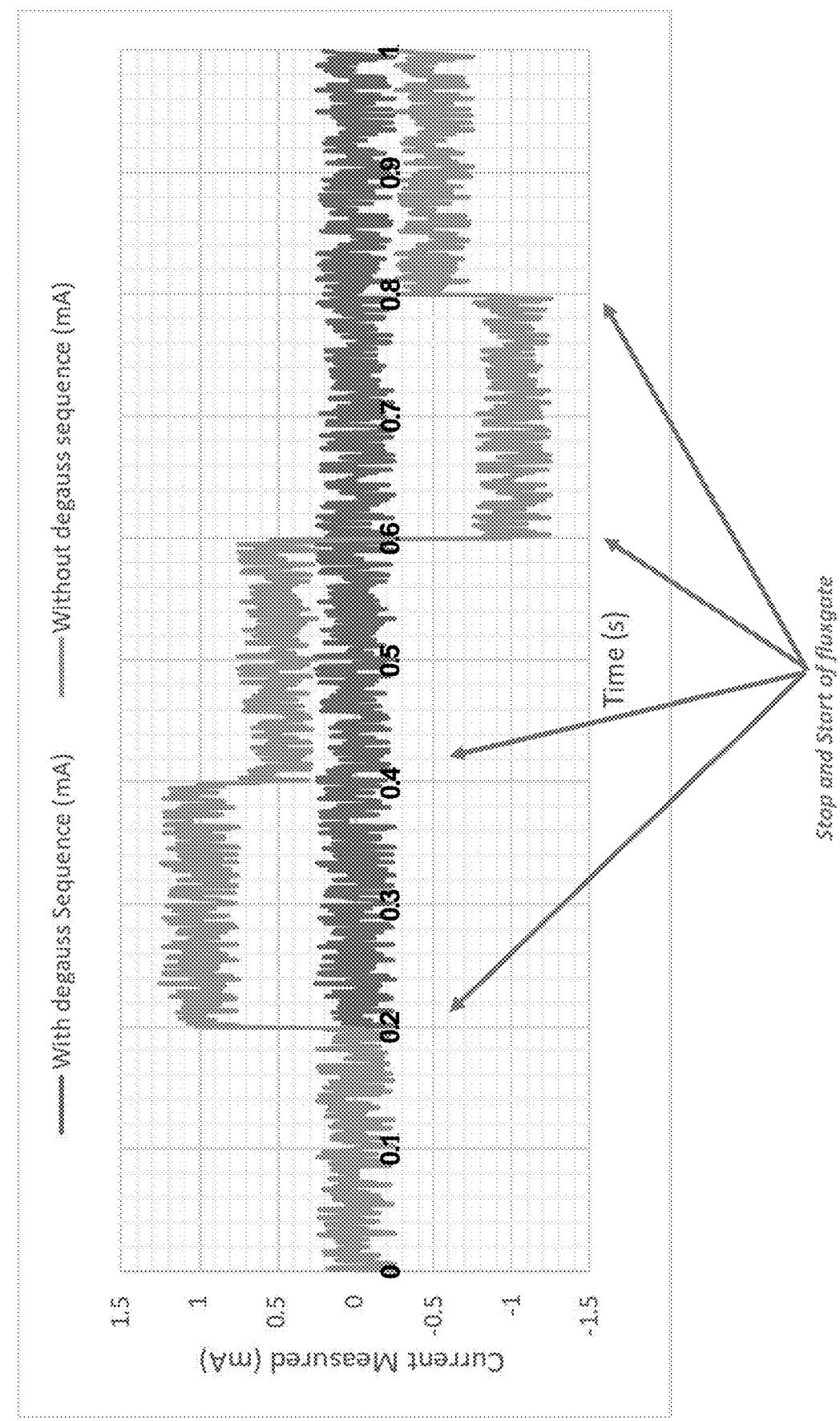
FIG. 4b illustrates a plot of a magnetic offset level of a magnetic a fluxgate transducer without and with a start-up sequence and procedure to reset the magnetic circuit remanence according to an embodiment of the invention.

FIG. 4b illustrates a magnetic offset of a fluxgate transducer without using the above described sequences (upper plot) and with use of the above described sequences (lower plot). It can be seen in the upper plot that without use of the proposed start-up sequence, there is a greater range of magnetization values leading to a magnetic offset that is undetermined and that cannot be accurately compensated for in the measurement output. In the lower plot with use of the proposed start-up sequence, there is a much smaller range of magnetization values, allowing to define a magnetic offset that can be compensated for with greater accuracy in the measurement output.

LIST OF FEATURES

Current Measurement System
  Fluxqate Current Transducer 1
  fluxgate device 2
  saturable soft magnetic core 6
  excitation coil(s) 8
  First coil 8a
  Second coil 8b
  test winding 10
  test winding interconnection interface 44
  control circuit 4
  First resistor 12
  First resistor bypass circuit 14
  Bypass circuit switch S3
  Excitation coil switches
  First switch S1
  Second switch S2
  Second resistor 20
  Microcontroller (MCU) 22
  Comparator 24
  DAC 26
  PWM module 28
  Combinatorial and Sequential Logic cell 30 (configurable)
  Capture module 32
  First Input capture 32a
  Second Input capture 32b
  First resistor switch control output (10) 34
  Excitation coils control output 36
  ADC 18
  Amplifier 42
  Reference voltage source 38
  Temperature measurement module 40
  Signal processing module 43
  First measurement output channel M1
  Second measurement output channel M2
  Third measurement output channel M3
  User system 3
  Interconnection circuit
  Microcontroller 5

The invention claimed is:

1. Fluxgate current transducer including a control circuit and a fluxgate device comprising a saturable soft magnetic core surrounded by an excitation coil, the control circuit comprising an excitation coil drive circuit connected to the excitation coil configured to generate an alternating magnetic field to alternatingly saturate the soft magnetic core, the excitation coil comprising a first winding and a second winding connected together at a common point forming an input of the first winding and an output of the second winding, the first winding connected in series to a first switch and the second winding connected in series to a second switch, the first and second switches controlled by the control circuit to provide an excitation coil current in the first winding generating a magnetic field in the magnetic core in a first direction, and an excitation coil current in the second winding generating a magnetic field in the magnetic core in a second direction opposite to the first direction, wherein the transducer comprises an analog measurement channel M2 connected to the excitation coil after the first and second switches, comprising an ADC module, and wherein the analog measurement channel further comprises a DAC connected to the ADC module and further connected to an input of a comparator having a first input connected to the excitation coil.

2. Fluxgate current transducer according to claim 1, wherein the first input of the comparator is connected to the excitation coil after the first and second switches.

3. Fluxgate current transducer according to claim 2, wherein a second input of the comparator is connected to a DAC supplying an adjustable reference voltage for adjusting an output level of the comparator.

4. Fluxgate current transducer according to claim 2, wherein the control circuit comprises a PWM module connected to an output of the comparator and configured to control a timing of operation of the first and second switches, including introducing a dead time between switching from one excitation coil winding to the other excitation coil winding.

5. Fluxgate current transducer according to claim 4, further comprising a combinatorial and sequential logic cell connected to an output of a PWM module for the generation of complementary signals including dead-time provided by the PWM module.

6. Fluxgate current transducer according to claim 4, comprising a capture module connected to an output of the PWM module for capturing a timing of switching signals.

7. Fluxgate current according to claim 1, wherein the analog measurement channel further comprises an amplifier to increase a gain and scale an offset of a measurement of a signal fed into the ADC module.

8. Fluxgate current transducer according to claim 1, wherein the control circuit further comprises a First resistor connected on a high side of the fluxgate device, the control circuit further comprising a third switch S3 placed in a bypass circuit parallel with the First resistor configured to short circuit the First resistor when the switch is switched to a closed position.

9. Fluxgate current transducer according to claim 8, wherein the analog measurement channel comprises a reference voltage source to control a supply reference voltage for the ADC module.

10. Fluxgate current transducer according to claim 1, further comprising a test winding wound around the magnetic core, the test winding connected to a connection interface of the fluxgate transducer for connection to an electronic circuit of a user system.

11. Fluxgate current transducer according to claim 10, wherein the test winding is configured to receive a test current from the user system and to output a voltage to the user system in a second mode of operation corresponding to a measurement signal of the magnetic field in the fluxgate device such that the test winding provides a third measurement channel M3.

12. Fluxgate current transducer according to claim 1, wherein the fluxgate transducer is connected to a user system to form together a current measurement system having at least three measurement channels, a first PWM channel M1, a second analog channel M2 and a third channel M3 provided by a test winding, the user system configured to compute a comparison of the measurement signals from the three measurement channels in order to determine correct or faulty operation.

13. Fluxgate current transducer according to claim 12, wherein an electronic circuit of the user system is configured to use two of three measurement signals that have values closest to each other, and to discard the other measurement signal in case of a fault that affects one of the measurement channels.

* * * * *